United States Patent [19]

Smith et al.

[11] Patent Number: 5,469,385
[45] Date of Patent: Nov. 21, 1995

[54] OUTPUT BUFFER WITH BOOST FROM VOLTAGE SUPPLIES

[75] Inventors: Scott E. Smith, Sugar Land; Duy-Loan T. Le, Missouri City, both of Tex.; Michael C. Stephens, Jr., Beaverton, Oreg.; Masayoshi Nomura, Ibaraki, Japan

[73] Assignee: Texas Instruments Incorporated, Dallas, Tex.

[21] Appl. No.: 60,323

[22] Filed: May 11, 1993

[51] Int. Cl.⁶ .......................................... G11C 7/00
[52] U.S. Cl. .................. 365/189.05; 365/189.11; 365/194
[58] Field of Search ................ 365/189.05, 189.09, 365/189.11, 227, 230.08, 194; 307/443

[56] References Cited

U.S. PATENT DOCUMENTS

| | | | |
|---|---|---|---|
| 4,397,000 | 8/1983 | Nagami | 365/189.05 |
| 5,057,711 | 10/1991 | Lee et al. | 365/189.05 |
| 5,058,066 | 10/1991 | Yu | 365/189.05 |
| 5,067,109 | 11/1991 | Kim et al. | 365/189.05 |
| 5,241,502 | 8/1993 | Lee et al. | 365/189.05 |
| 5,295,098 | 3/1994 | Kohno | 365/189.05 |
| 5,311,076 | 5/1994 | Park et al. | 365/189.05 |
| 5,331,593 | 7/1994 | Merritt et al. | 365/189.05 |

*Primary Examiner*—Joseph A. Popek
*Assistant Examiner*—Tan Nguyen
*Attorney, Agent, or Firm*—William W. Holloway; Richard L. Donaldson

[57] ABSTRACT

An MOS DRAM memory device includes an output buffer having an N-channel output transistor that must receive a boosted gate signal to produce a full Vdd output high logic level signal at the output terminal. The N-channel transistor connects between the Vdd supply voltage and the output terminal. The output buffer connects a Vdd supply voltage to the gate of the output transistor for a short period sufficient to raise the gate to the Vdd voltage level and then disconnects the Vdd supply. The buffer then connects a Vdd+ supply voltage to the gate to increase the gate voltage at least one transistor threshold value above the Vdd supply voltage. This provides the Vdd voltage at the output terminal.

8 Claims, 4 Drawing Sheets

5,469,385

OUTPUT BUFFER WITH BOOST FROM VOLTAGE SUPPLIES

FIELD OF THE INVENTION

This invention relates to integrated circuits having N-channel metal oxide semiconductor (MOS), pull-up output transistors and in particular to complementary metal-oxide semiconductor, CMOS, memory integrated circuits having an output buffer with an N-channel pull-up output transistor that must receive a boosted voltage on its gate to attain a full voltage supply level on the output terminal.

DESCRIPTION OF THE RELATED ART

Semiconductor memory integrated circuits come in several types, including dynamic random access memory, DRAM, read only memory, ROM, static random access memory, SRAM, and electrically erasable and programmable read only memory, EEPROM. All of these types of memory devices presently furnish large arrays of memory cells that can be accessed one bit at a time or several bits in parallel at one time.

A memory part accessed sixteen bits at a time is called a "by sixteen" or "×16" part. Thus a memory device having an array of 16,777,216, or 16M, bits can be arranged to be accessed sixteen bits at a time and be identified as 1M×16. The parts accessed in many bits in parallel are also known as "wide word" parts because of the many bits representing wide words of data bits. Many applications need wide words of data and only a single memory device arranged in a ×16 configuration.

Wide word memory parts use many output buffers, one output buffer for each output bit or terminal. Two considerations for every output buffer are the speed at which the bit becomes valid at the output terminals and the power needed to produce the output signal. With wide word parts, a power saving in one output buffer becomes multiplied by the number of output buffers and can be significant. Fast access speed is one of the primary specifications for any memory device.

Output buffers typically use N-channel transistors, where the basic conduction mechanism is governed by electrons, for the pull-up device to avoid latch-up problems in CMOS designs. N-channel transistors however exhibit a threshold voltage drop across their source to drain, or from the off-chip voltage supply Vdd to the output terminal. This fails to effect a full logical high level of the voltage supply Vdd on the output terminal, and has been corrected by booting or boosting the gate of the N-channel transistor to above the voltage of the supply Vdd.

Capacitive boosting of the N-channel gate can degrade the speed of the output buffer because of the time needed to set up the boosting circuitry. Capacitive boosting also increases the size of the output buffer because of the extra boosting capacitor and logic.

An on chip voltage supply Vdd+, regulated to provide a voltage above the supply voltage Vdd, often uses charge pumps to supply the current required by the load. For a large load current, the Vdd+ power supply needs more chip area and uses more power from the voltage supply Vdd. U.S. Pat. No. 4,638,182 discloses using the voltage supply Vdd to raise the gate of the N-channel transistor part way and the voltage supply Vdd+ to boost the gate the rest of the way. That solution relies upon voltage levels sequentially to connect the voltage supplies Vdd and Vdd+ to the driven line and to prevent current from flowing back into the voltage supply Vdd.

SUMMARY OF THE INVENTION

According to one embodiment, an MOS DRAM memory device includes an output buffer having an N-channel output transistor that must receive a boosted gate signal to produce a full Vdd output high logic level signal at the output terminal. The N-channel transistor connects between the Vdd supply voltage and the output terminal. The output buffer connects a Vdd supply voltage to the gate of the output transistor for a short period sufficient to raise the gate to the Vdd voltage level and then disconnects the Vdd supply. The buffer then connects a Vdd+ supply voltage (an elevated voltage above Vdd) to the gate to increase the gate voltage at least one transistor threshold value above the Vdd supply voltage. This provides the Vdd voltage at the output terminal. An important feature is that the driver voltage is multiplexed between the Vdd and Vdd+ supplies in a manner determined by a delay voltage generated on-chip; thus, the driver voltage is driven by Vdd for a selected time to raise the output level to at or near Vdd, then the charging path is switched to Vdd+ to raise the level the rest of the way to Vdd+.

Also, according to an embodiment, a memory device is provided comprising an array of memory cells with each cell retaining one or another logic level representing a bit of data; a first supply providing a first voltage relative to a reference and having a current capacity to supply the entire device, the first voltage being substantially equal to the one logic level to be output from the memory device; a second supply providing a second voltage relative to the reference, the second supply having a current capacity less than the first supply and the second voltage being at least one N-channel transistor threshold level greater than the first voltage; and an output buffer coupled to the array of memory cells and having an N-channel output transistor connected between the first supply and an output terminal for producing a first voltage level on the output terminal to output a selected data bit of the one logic level, the output buffer including first switching circuits connecting the first supply to the gate of the N-channel transistor for a certain period and then connecting the second supply to the gate of the N-channel transistor.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF AN EMBODIMENT OF THE INVENTION

Figure 1:
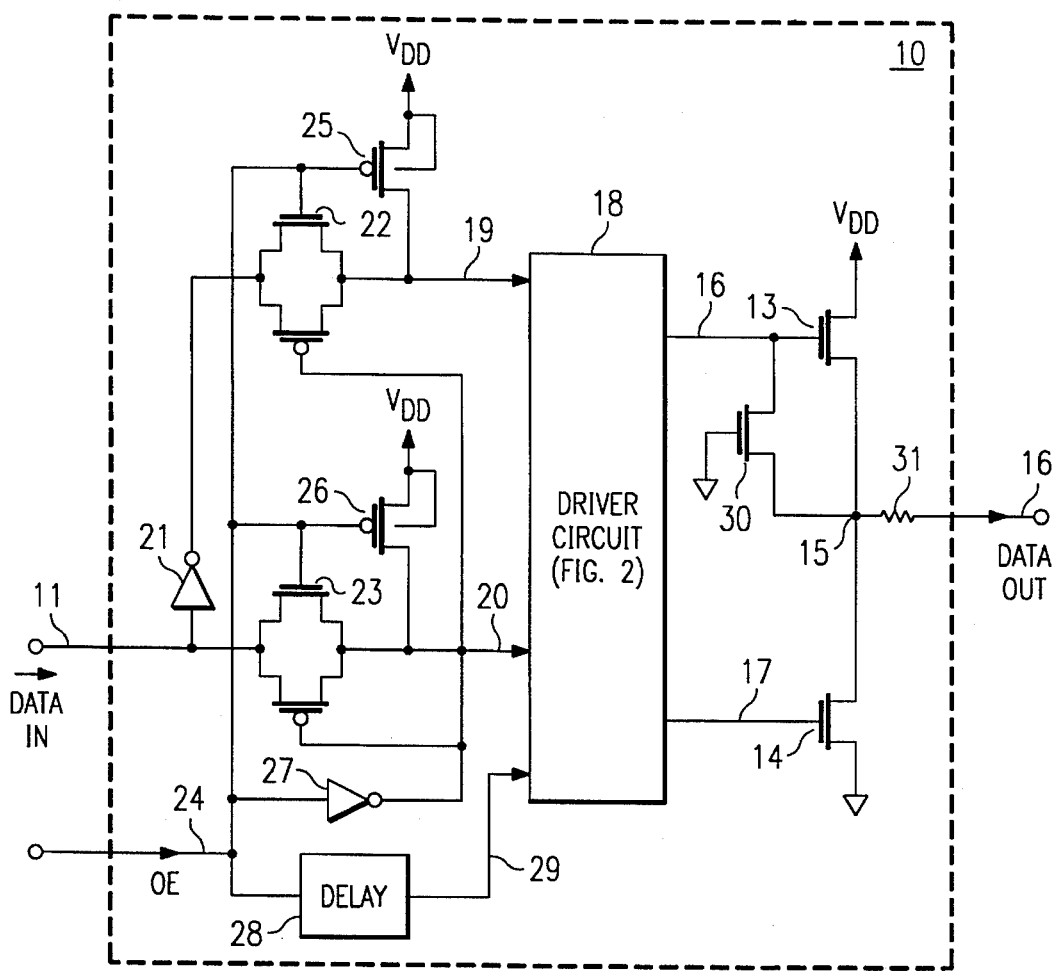
FIG. 1 is an electrical diagram of an output buffer circuit according to an embodiment of the invention.

Referring to FIG. 1, an output buffer circuit 10 is illustrated according to one embodiment of the invention. A logic input 11 is the data output from a selected bit of a memory array, in the usual manner. An output 12 of the buffer circuit 10 is used to drive an output pad and pin of an integrated circuit package. A pair of large N-channel output driver transistors 13 and 14 are used to drive the output 12. The N-channel transistor 13 is a pull-up transistor and the N-channel transistor 14 is a pulldown, forcing the intermediate node 15 to either Vdd via transistor 13 or ground, Vss, via transistor 14. It is of course important that the driver transistors 13 and 14 be turned on in a mutually exclusive manner, so that a path from Vdd to Vss through both transistors 13 and 14 never exists. So, the gates 16 and 17 of the transistors 13 and 14 are driven by separate drive signals produced by a driver circuit 18, shown in FIG. 2. That is, if the output 12 is to be a "1" the pull-up transistor 13 is turned on by a positive voltage on gate 16 while the gate 17 is at Vss, and if the output 12 is to be a "0" the pull-down transistor 14 is turned on by a positive voltage on the gate 17 while the gate 16 is held at Vss.

The output buffer circuit of FIG. 1 uses two supply voltages, one being the usual Vdd supply which is used throughout the chip, supplied by an external pin, usually +3.3 or +5.0 Vdc. The other is a Vdd+ supply which is generated on-chip by voltage boosting circuits and is about one or two threshold voltage levels above Vdd. This Vdd+ supply is thus of very limited current capability, since it is generated on-chip. Providing a larger current capability is at the expense of chip size, since large capacitors are needed. It is for this reason that the use of current from the Vdd+ supply is to be minimized, yet charging of internal nodes to the Vdd+ level is still performed in an efficient manner.

The data input 11 for the buffer circuit 10 of FIG. 1 is applied to the driver 18 as two separate inputs 19 and 20, one for a logic "1" and the other for a logic "0." An inverter 21 and a CMOS pass gate 22 are in series between the input 11 and the driver input 19, and only a CMOS pass gate 23 is in series between the input 11 and the driver input 20. P-channel pull-up devices are used to precharge the driver inputs 19 and 20 to Vdd when an output enable line 24 is high, i.e., in the off-cycle. This also serves to tri-state the output 12. The output enable line 24 is connected directly to the gates of N-channel transistors of the pass gates 22 and 23, and to the P-channel pull-up transistors 25 and 26. Also, the output enable line 24 is connected through an inverter 27 to gates of the P-channel transistors in pass gates 22 and 23, placing the inverse of the OE voltage on these P-channel gates. Thus, when OE is low the precharge transistors 25 and 26 are turned on and the pass gates are off. When the output enable line 24 is active (high) the pass gates are conductive and the precharge transistors 25 and 26 are off. Only one of the driver input lines 19 or 20 can be active-low at any one time, not both. The output enable line 24 is also connected through a delay circuit 28, FIG. 3, to a delayed input 29 to the driver circuit 18, as will be explained, producing a longer OE signal, i.e., the falling edge of the delayed OE signal on line 29 is delayed after the OE input 24 falls; the leading edge is not delayed.

The output node 12 may be driven to negative voltages by the circuits to which the node is connected. For this reason, an N-channel transistor 30 is connected between the node 15 and the gate 16, with its gate connected to ground, Vss. This allows the gate 16 to follow the node 15 if it goes negative, tending to keep the N-channel transistor from turning on when it shouldn't, i.e., the pull-up transistor 13 should not turn on when the output node 12 is driven negative by external circuitry. A series resistor 140 formed in the N-well of the output transistors has two purposes; it provides better ESD protection and it helps damp the output to minimize ringing.

Figure 2:
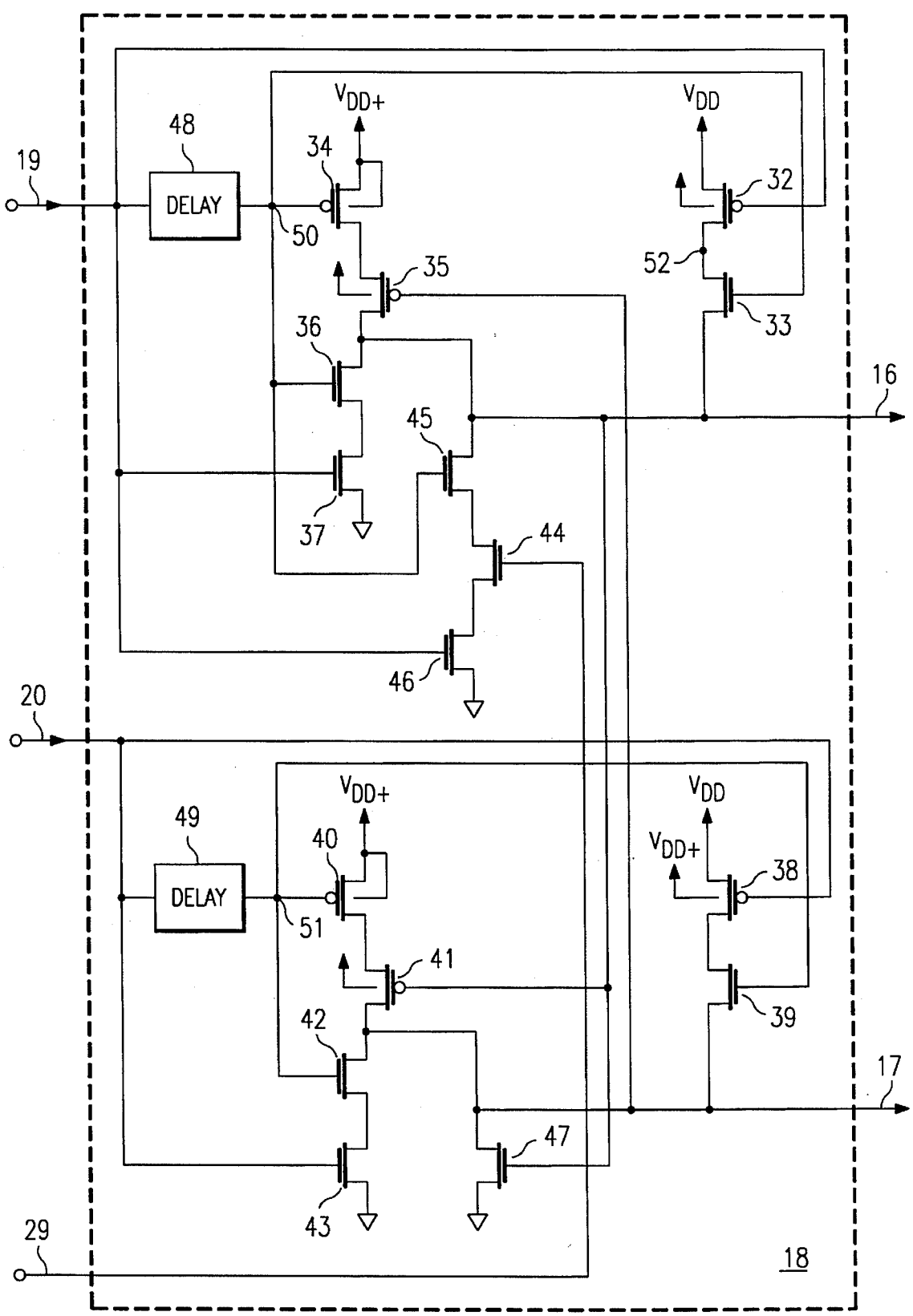
FIG. 2 is an electrical diagram of a driver circuit used in the circuit of FIG. 1 according to one embodiment, employing the stepping feature for the drive voltages.

Referring to FIG. 2, the driver circuit 18 has two functions. The first is to guarantee that gate lines 16 and 17 cannot be high at the same time. The second is to "step" the voltage of line 16 or line 17 up to Vdd+ in such a manner as to minimize current usage from the Vdd+ source. This saves power from the Vdd+ source by mixing the signals on gates 16 or 17 between Vdd and Vdd+. For the upper half of the circuit, the line 16 is pulled up to Vdd by a series-connected pair of N-channel and P-channel transistors 32 and 33, or pulled up to Vdd+ by a series-connected pair of N-channel and P-channel transistors 34 and 35. The line 16 is pulled down to Vss by a series-connected pair of N-channel transistors 36 and 37. Similarly, for the lower half of the circuit 18, the line 17 is pulled up to Vdd by a series-connected pair of N-channel and P-channel transistors 38 and 39, or pulled up to Vdd+ by a series-connected pair of N-channel and P-channel transistors 40 and 41. The line 16 is pulled down to Vss by a series-connected pair of N-channel transistors 42 and 43. The delayed OE signal on line 29 is connected to a transistor 44 in a series-connected set of three N-channel transistors 44, 45, and 46 in the upper circuit, for reasons as will be explained. An N-channel transistor 47 is connected between the line 17 and Vss, with its gate connected to the line 16, to make sure the pull-down transistor 14 is off (gate connected to Vss) when the pull-up transistor 13 is one (gate high).

Figure 3:
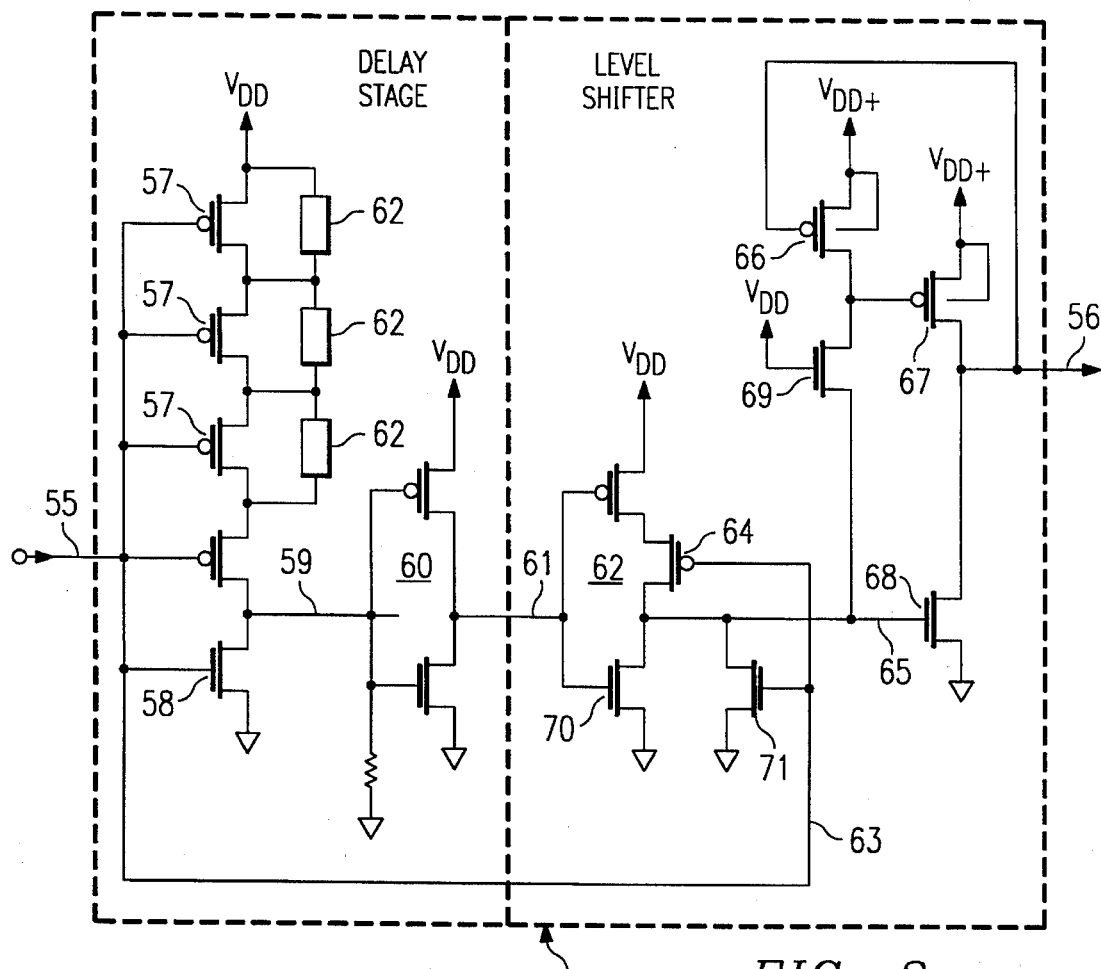
FIG. 3 is an electrical diagram of a delay circuit and level shifter used in the circuit of FIG. 2.

A pair of delay circuits 48 and 49, of the type shown in FIG. 3, connect the driver inputs 19 and 20 to intermediate nodes 50 and 51. These delay circuits 48 and 49 delay and level shift the inputs so the nodes 50 and 51 swing between Vss and Vdd+ (not Vdd as the lines 19 and 20). Initially the nodes 50 and 51 are sitting at Vdd+ level and lines 19 and 20 are at Vdd level; this will force driver outputs 16 and 17 low via transistors 36, 37 and 42, 43. When data enters the output buffer 10 via line 11, either input 19 or input 20 will go low. If input 19 goes low then transistor 33 will turn on and the line 16 will start charging toward Vdd. Some delay later the node 50 will go low which will turn off the N-channel transistor 32 (isolating line 16 from Vdd) and P-channel transistor 34 will turn on which will charge line 16 to Vdd+, via transistor 35. When the input 19 goes back high at the end of the data cycle, it will first turn off transistor 33 and turn on N-channel transistor 37; when it propagates through delay 48 the node 50 will go to Vdd+ and N-channel transistor 36 will turn on, this will discharge line 16 to Vss through transistors 36 and 37. The lower half of the circuit operates similarly for charging and discharging of line 17 from line 20. The P-channel transistors 35 and 41 function to keep lines 16 and 17 from being at Vdd+ at the same time, which is a necessary function; the gates of these transistors 35 and 41 are cross-connected to the lines 16 and 17. Note that since the gate of N-channel transistor 32 will be a Vdd+ signal then the node 52 between the two can be no higher than (Vdd+)−Vtn; this will guarantee that the tank of P-channel transistor 33 will never forward bias since it is tied to Vdd+.

The delay stages 28, 48 and 49 are constructed as seen in

FIG. 3, and consist of a high-to-low delay and level shifter. An input such as input line 55 (e.g., connected to the input 19) receives the logic input voltage, and an output is produced on the output node 56 (e.g., going to the node 50). A programmable delay is provided by a number of series connected P-channel transistors 57, with an N-channel transistor 58, configured as an inverter. The output 59 of this inverter is connected by another inverter 60 to an intermediate node 61. The output at node 61 is a two-inverter delay from the input 55, in phase with the input. The amount of delay can be programmed by metallization switches 62 in manufacture of the integrated circuit. The node 61 is the input to the level shifter part of the circuit of FIG. 3. An inverter 62, gated by the input 55 on line 63 which is an input to the gate of a P-channel transistor 64, produces an output on node 65 at Vdd level. When this node 65 is high, the level is shifted to Vdd+ by P-channel pull-up transistors 66 and 67, pulling up the output 56 to Vdd+, or when the node 65 is low an N-channel pull-down transistor 68 holds the output 56 at Vss. An N-channel transistor 69 keeps the Vdd+ supply from being drained to Vss through transistors 70 or 71 on node 65. The transistor 71, with gate connected to input 55, holds the node 65 at Vss, and allows the output 56 to go high, when the input 55 is high.

The delay stage 48 will provide time for the Vdd+ supply to charge up the output buffer gates, and the level shifter will insure that the P-channel transistors 33 and 34 (39 and 40) will be completely turned off. Tests have shown that when the delay introduced by the delay stage is set for a minimum amount by switches 62, the reduction of Vdd+ current is about 30%, while if the switches 62 are set for maximum delay then a savings of 60% is provided. The price for this current savings is speed because Vdd+ alone is not strong enough to turn on the pull-up N-channel transistor driver of the output buffer circuit 10.

Figure 4:
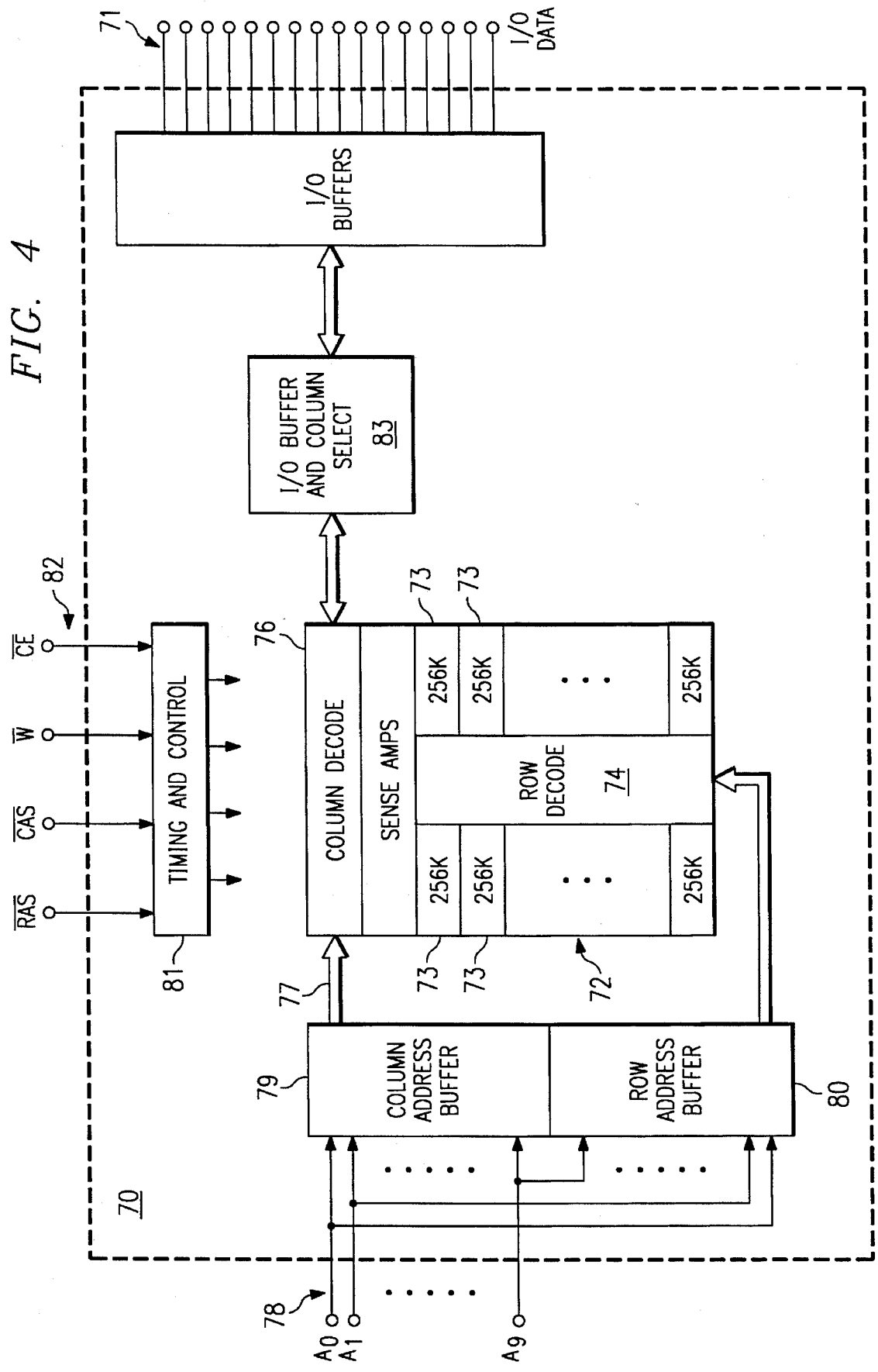
FIG. 4 is a block diagram of a memory device incorporating the output buffer of the invention.

Referring to FIG. 4, a memory device 70 is illustrated in which the output buffer circuits of the invention may be used. This is a 16 Mbit DRAM or the like, having 16-bit or 18-bit parallel data I/O on lines 71. Thus sixteen or eighteen output buffers 10 are used on the chip, connected to these lines 71, so these must be of minimum area and minimum power dissipation. The cell array 72 of the memory device consists of a number of 256K-bit arrays 73, with a row decoder 74 for selecting rows from a row address on lines 75, and a column decoder 76 for selecting columns from a column address on lines 77. The row and column addresses are multiplexed in the usual manner, using address lines 78 and separate row and column address buffers 79 and 80. Timing and control circuit 81 receives row address strobe and column address strobe signals on lines 82, as well as a read/write signal and an output enable signal, from off chip, to generate clocks and controls used on chip. Part of the column selection is performed in a data I/O buffer and column select circuit 83, which includes intermediate I/O buffers driving the output buffers 10 of the invention with the signals on lines 11.

Figure 5:
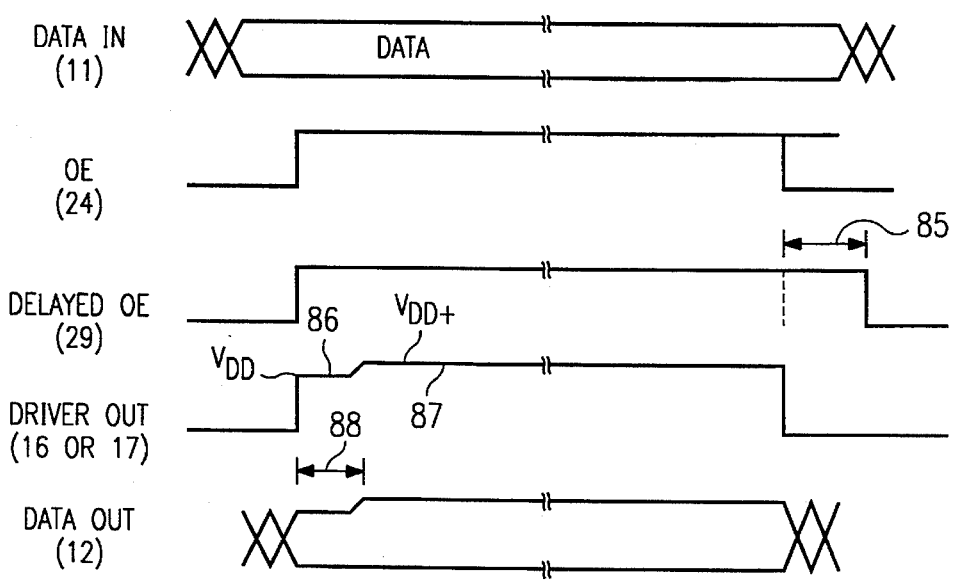
FIG. 5 is a timing diagram depicting the voltage levels of selected nodes of the output buffer of FIG. 1 during normal use.

Referring to FIG. 5, the waveforms of various voltages appearing in the circuit of FIG. 1 are illustrated, labelled with the node or line numbers from FIG. 1. The data input at line 11 would ordinarily be valid longer than the output enable OE on line 24. The delay at the end of the OE signal on line 29 for a period 85 is seen. The driver output signals on lines 16 and 17 have a period of Vdd level at 86, followed by the remainder at Vdd+ level at 87. Likewise the data output on line 12 is a slightly lower level at first, then goes to a full Vdd level. The delay 88 introduced by the circuits 48 or 49.

Figure 6:
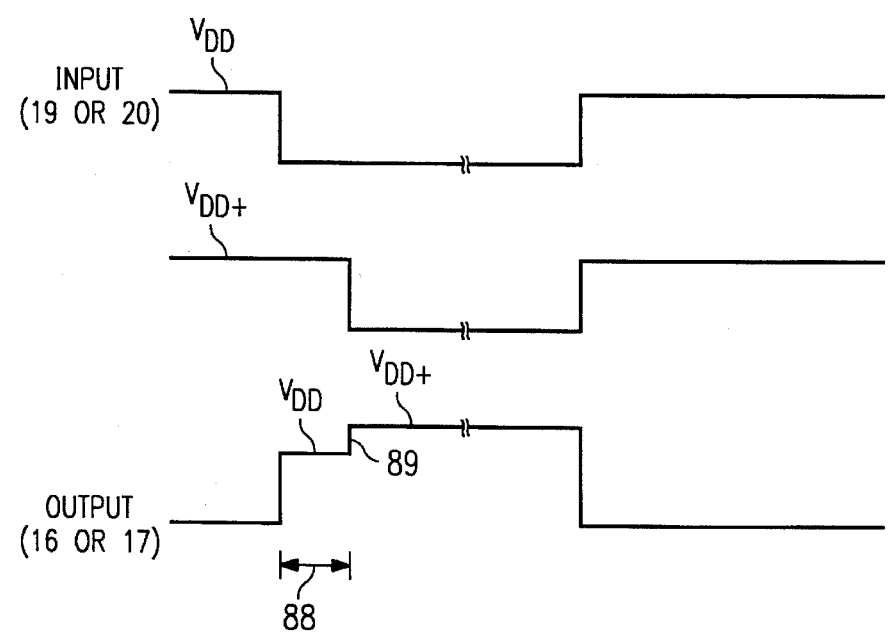
FIG. 6 is a timing diagram depicting the voltage levels of selected nodes of the driver circuit of FIG. 4.

FIG. 6 illustrates the waveforms of voltages appearing in the driver circuit of FIG. 2, for the upper half or high side. The lower half operates the same way. The voltage on input 19 appears at node 50 with the delay 88 in the high-to-low transition, producing the step 89 in the output at line 16 from the driver, where the level goes from Vdd to Vdd+.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. An output buffer circuit having an output terminal providing a logical high level substantially equal to the voltage of a first supply, relative to a reference, the output buffer having an N-channel MOS transistor connected between the first supply and the output terminal, the N-channel transistor exhibiting a threshold voltage drop from the voltage applied to its gate to the output terminal, the buffer also being connected to a second supply, which has a limited capacity in comparison to the first supply and which provides a voltage of at least the threshold of the N-channel transistor greater than the first supply, relative to the same reference, the buffer circuit comprising:

A. a first circuit for connecting the first supply to the gate of the N-channel transistor for a only certain period to increase the voltage on the gate of the N-channel transistor from the reference to the level of the first supply;

B. a second circuit for connecting the gate of the N-channel transistor to the second supply immediately after the end of the certain period to increase the voltage on the gate to that of the second supply and increase the voltage on the output terminal to that of the first supply; and C. a delay circuit for switching between said first supply and said second supply at the end of said certain period.

2. The output buffer of claim 1 including a pull down transistor connected between the output terminal and the reference, and a third and a fourth circuit connected to the gate of the pull down transistor, the third circuit being substantially similar to the first circuit and the fourth circuit being substantially similar to the second circuit.

3. The output buffer of claim 1 including output, pull down transistor connected between the output terminal and the reference, and a third and a fourth circuit connected to the gate of the output, pull down transistor, the third circuit being substantially similar to the first circuit and the fourth circuit being substantially similar to the second circuit.

4. A memory device comprising:

A. an array of memory cells with each cell retaining one or another logic level representing a bit of data;

B. a first supply providing a first voltage relative to a reference and having a current capacity to supply the entire device, the first voltage being substantially equal to the one logic level to be output from the memory device;

C. a second supply providing a second voltage relative to the reference, the second supply having a current capacity less than the first supply and the second voltage being at least one N-channel transistor threshold level greater than the first voltage; and D. an output buffer coupled to the array of memory cells and having an N-channel MOS, output transistor connected between the first supply and an output terminal for producing a first voltage level on the output terminal to output a selected data bit of the one logic level, the output buffer including first switching circuits connecting the first supply to the gate of the N-channel transistor for a certain period and then connecting the second supply to the gate of the N-channel transistor.

5. The memory device of claim 4 in which the switching circuits include a first circuit connecting the first supply to the transistor's gate, a second circuit connecting the second supply to the transistor's gate and a delay circuit started by the first circuit and starting the operation of the second circuit.

6. The memory device of claim 4 in which the output buffer includes output, pull down transistor, having a gate, connected between the output terminal and the reference for providing the reference on the output terminal in response to a selected data bit of the other logic level, and the output buffer including second switching circuits connecting the first supply to the gate of the output, pull down transistor for a certain period and then connecting the second supply to the gate of the output, pull down transistor.

7. A method of boosting the voltage to the gate of a N-channel MOS, output transistor above an output high logic level voltage, comprising the steps of:

A. connecting a first supply having a voltage equal to the output high logic level voltage to the gate of the output transistor for a certain period;

B. disconnecting the first supply from the gate of the output transistor; and

C. sequentially connecting a second supply having a voltage above the output high logic level voltage to the gate of the output transistor.

8. The method of claim 7 including producing a delay signal equal in length to the certain period, the connecting the first supply beginning the delay signal and the disconnecting the first supply occurring at the end of the timing signal.

* * * * *